United States Patent [19]
Hoshi

[11] Patent Number: 5,196,375
[45] Date of Patent: Mar. 23, 1993

[54] METHOD FOR MANUFACTURING BONDED SEMICONDUCTOR BODY

[75] Inventor: Tadahide Hoshi, Yokohama, Japan

[73] Assignee: Kabushiki Kaisha Toshiba, Kawasaki, Japan

[21] Appl. No.: 737,805

[22] Filed: Jul. 29, 1991

Related U.S. Application Data

[63] Continuation of Ser. No. 506,521, Apr. 6, 1990, which is a continuation of Ser. No. 221,572, Jul. 20, 1988, abandoned.

[30] Foreign Application Priority Data

Jul. 24, 1987 [JP] Japan ................................ 62-183518

[51] Int. Cl.⁵ .......................................... H01L 21/302
[52] U.S. Cl. .................................... 437/225; 437/946; 437/247; 148/DIG. 12; 148/DIG. 17; 148/DIG. 135
[58] Field of Search ................ 437/225, 226, 946, 247; 156/903, 273.9; 148/DIG. 12, DIG. 3, DIG. 54, DIG. 135, DIG. 17

[56] References Cited

U.S. PATENT DOCUMENTS

| | | |
|---|---|---|
| 4,638,552 | 1/1987 | Shimbo et al. ............. 148/DIG. 12 |
| 4,671,846 | 6/1987 | Shimbo et al. ........................ 156/629 |
| 4,700,466 | 10/1987 | Nakagawa et al. .................. 437/247 |
| 4,738,935 | 4/1988 | Shimbo et al. ........................ 437/225 |

FOREIGN PATENT DOCUMENTS

| | | |
|---|---|---|
| 161740 | 11/1985 | European Pat. Off. . |
| 190508 | 8/1986 | European Pat. Off. . |
| 190935 | 8/1986 | European Pat. Off. . |
| 60-51700 | 3/1985 | Japan . |
| 85-6424 | 5/1985 | Japan . |
| 62-122141 | 6/1987 | Japan . |

OTHER PUBLICATIONS

Ishikawa, M., "Papers in the Scientific Lectures in Aluminum Meeting of 'Seiki Gakkai,' Showa–56," 1981, pp. 440, 450, and 451.

Shimbo, M., "Silicon-to-Silicon Direct Bonding Method," J. Appl. Phys., vol. 60, No. 8, Oct. 15, 1986, pp. 2987-2989.

Black, R. D., "Silicon and Silicon Dioxide Thermal Bonding for Silicon-on-Insulator Applications," J. Appl. Phys., vol. 63, No. 8, Apr. 15, 1988, pp. 2773-2777.

Halliday, D., Fundamentals of Physics, 2nd Ed., Extended Version, 1981, p. 661.

McGraw-Hill Encyclopedia of Science & Technology, 5th Ed., vol. 7, 1982, pp. 147-151.

Von Nostrand's Scientific Encyclopedia, 7th Ed., Considine, D., ed., 1989, pp. 1551-1554.

Primary Examiner—Brian E. Hearn
Assistant Examiner—Tuan Nguyen
Attorney, Agent, or Firm—Finnegan, Henderson, Farabow, Garrett and Dunner

[57] ABSTRACT

A method for manufacturing a bonded semiconductor body including contacting the flat mirror surfaces of semiconductor substrate wafers used as semiconductor element substrates, and subjecting the adhered semiconductor substrate wafers to a heat treatment at a temperature higher than 200° C. and lower than the melting point of the semiconductor substrate wafers to bond the mirror surfaces. The surface roughness of each of the mirror surfaces of the semiconductor substrate wafers is set not more than 130 Å at its maximum value when measured in a range of 1 mm on a reference plane provided in a predetermined area of the mirror surface.

17 Claims, 5 Drawing Sheets

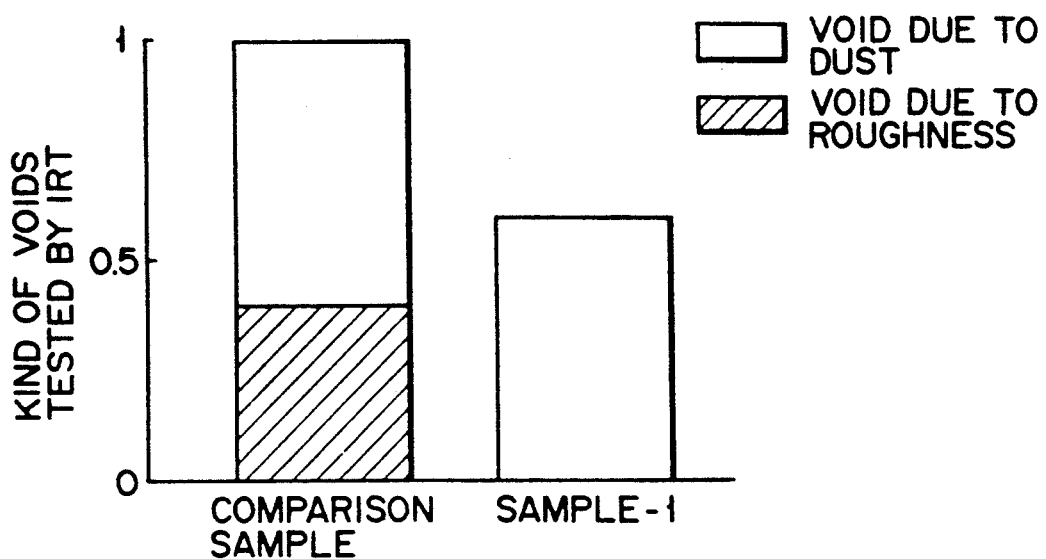
F I G. 4
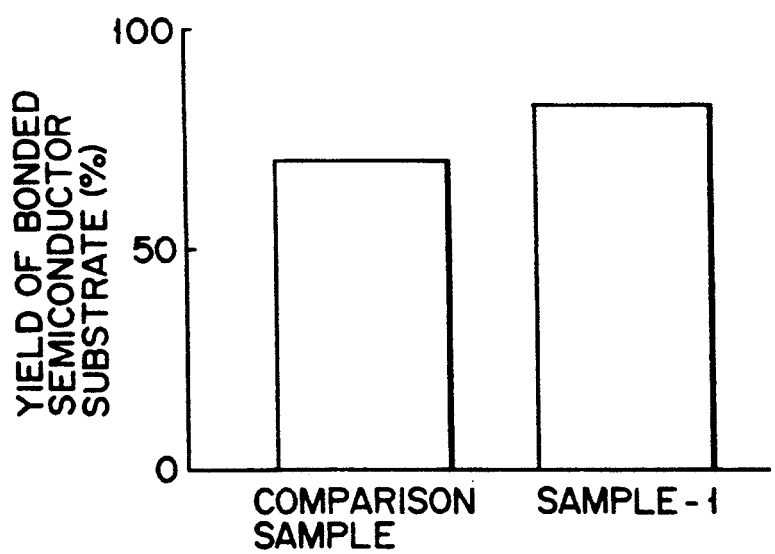
F I G. 5

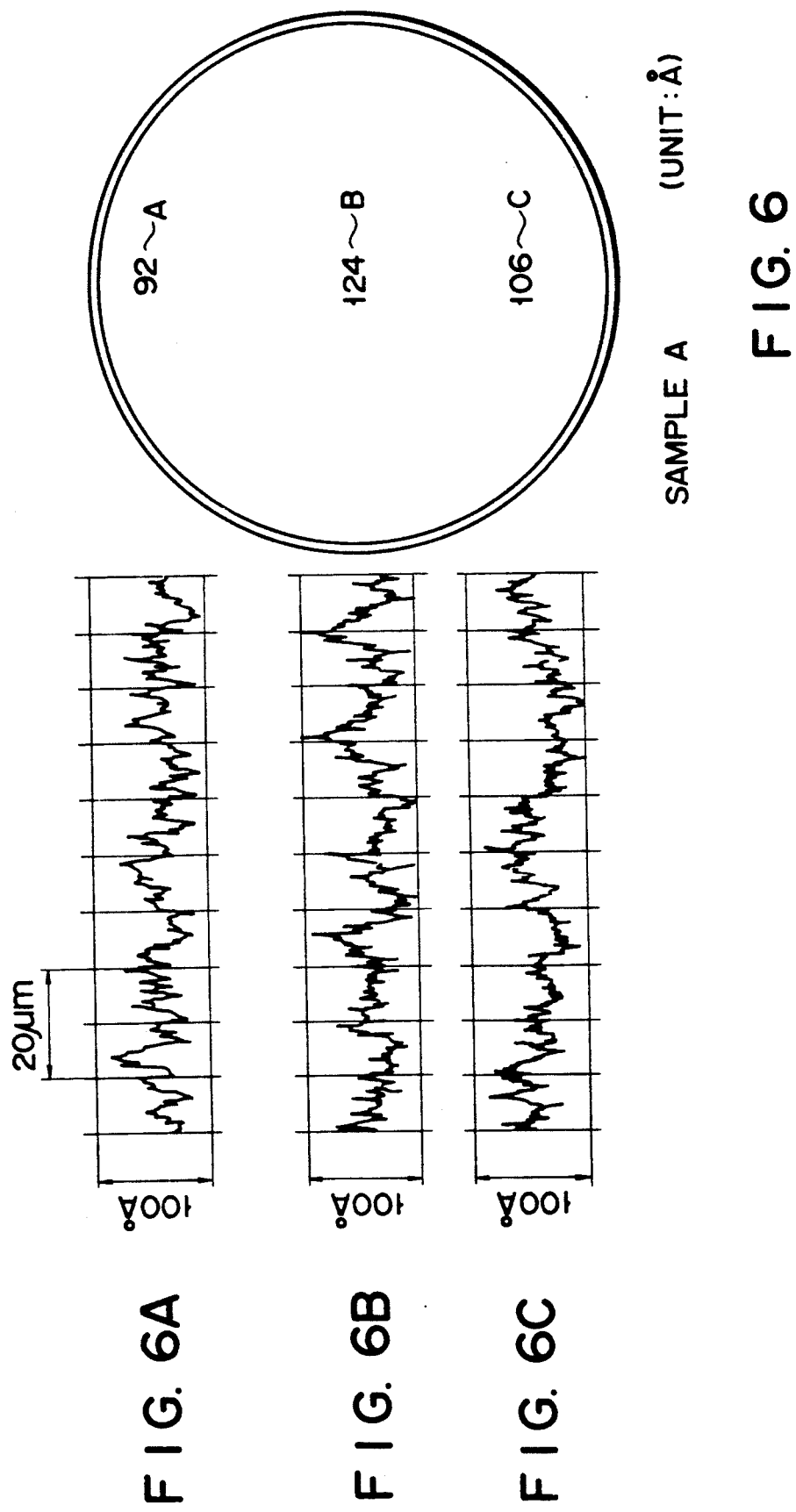

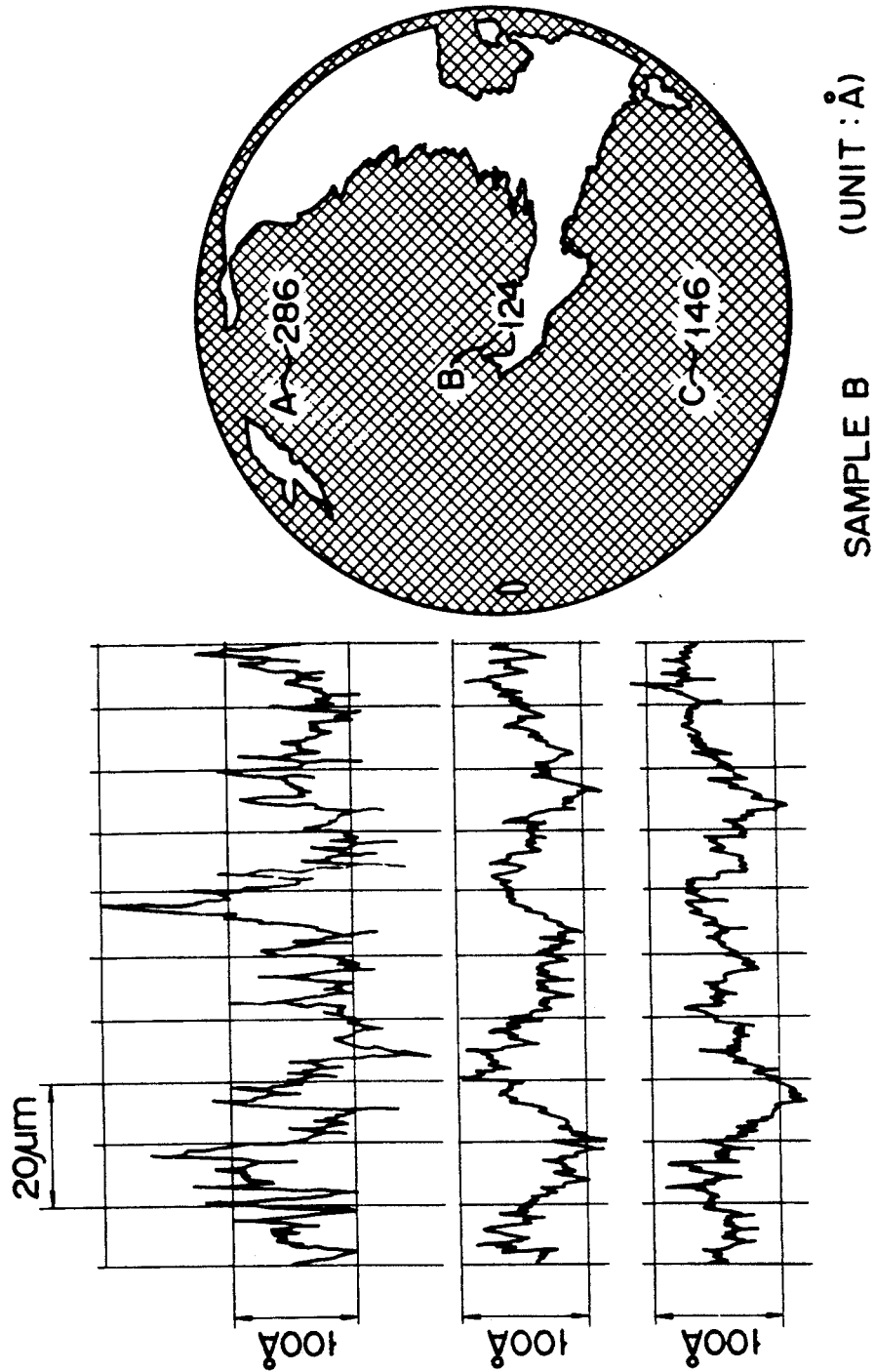

METHOD FOR MANUFACTURING BONDED SEMICONDUCTOR BODY

This application is a continuation of application Ser. No. 506,521, filed Apr. 6, 1990, which is a continuation of application Ser. No. 221,572, filed Jul. 20, 1988 now abandoned.

BACKGROUND OF THE INVENTION

1. Field of the Invention

This invention relates to a method for manufacturing bonded semiconductor bodies, and more particularly to a method for manufacturing semiconductor bodies by directly bonding silicon substrates together, or directly bonding a substrate of Si, GaAs or other semiconductor material with a substrate of the same material or different semiconductor material.

2. Description of the Related Art

With a bonded semiconductor body, pn junctions and heterojunctions, which have been considered difficult to form in the prior art can be easily formed in a short period of time. For example, in order to form a pn junction of $n^-$-type and $p^-$-type layers having a thickness of 50 to 100 $\mu$m, the cost will be high when the conventional epitaxial method is used, and it takes as long as three to ten days if a triple diffusion method is used. However, the pn junction can be obtained in a period of as short as two hours by directly bonding the $n^-$-type and $p^-$-type layers together.

According to a conventional method for manufacturing the bonded semiconductor body, both the surfaces of Si substrates 1 and 2, facing at bonding interface 3, are cleaned and polished to make a mirror surface with a surface roughness (maximum height) of less than 500 Å. The mirror surfaces are physically brought into contact with each other in a clean atmosphere with no dust, and then the two substrates are subjected to a heat treatment at a temperature of higher than 200° C., normally at a temperature of 1100° C., for two hours in an $N_2$ gas atmosphere so as to increase the chemical bonding strength between the two substrates (Japanese Patent Disclosure 60-51700 and U.S. patent application No. 824,100 which was filed on Jan. 30, 1986 and is now abandoned).

With such a bonded semiconductor body (4), the bonding strength between the two contacted substrates prior to the heat treatment is approximately 5 kg/cm$^2$, but the bonding strength can be increased to 100 kg/cm$^2$ after the heat treatment. The outer surface of the bonded semiconductor body, which is different from the bonded surface, is subjected to rough polishing and finish polishing in this order, and then semiconductor elements and electrodes are formed in and on the bonded semiconductor body in the same manner as in the case of using a single semiconductor substrate.

In the above conventional method for manufacturing the bonded semiconductor body, if dust remains on the bonding surface prior to the step of contacting or adhering the two substrates, the two mirror surfaces cannot be adhered in a good contact condition and voids will occur between them. It is well known in the art that concentric interference fringes are detected around the dust when the bonded semiconductor body having such voids due to dust is observed by use of infrared topography [which is disclosed in the technical report of disclosure 85-6424 issued from the Japanese Patent Association (HATSUMEI KYOUKAI)]. Conventionally, a bonded semiconductor body (4) having the above-mentioned large bonding strength (100 kg/cm$^2$) can be obtained in a manner in which a pair of semiconductor wafers, each having a surface roughness of less than 500 g and a total thickness variation range for the bonding areaof 5 $\mu$m, are prepared, and they are contacted with each other in a clean atmosphere condition through which an interference fringe of voids due to dust is minimized.

The inventor of the present patent application has known that when bonded semiconductor body 4 obtained by the above manner is observed by infrared topography, dark portions like the surface of the moon or Mars may sometimes be observed, as is shown in FIG. 1A. However, at present, the inventor does not know anyone who has investigated the specific relation between the dark portions as shown in FIG. 1A and in defects the resultant bonded semiconductor body. This is probably because the dark portions like the surface of Mars disappear after suitable heat treatment, as is shown in FIG. 1B and, after such heat treatment, the final product of bonded semiconductor body 4 has a large bonding strength as mentioned above.

Thus, at present, no one knows what advantages can be obtained by removing the above-mentioned dark portions like the surface of Mars. Of course, no one knows how to determine the surface roughness of the semiconductor wafers in order to remove the dark portions before applying a heat treatment. In the prior art, the dark portions have not been considered as a defective factor in association with the surface roughness.

Defects in the bonded semiconductor body can be found after the final product of the bonded semiconductor body, on which many circuit elements are formed, is diced into small pieces or chips. Bonded semiconductor body 4 shown in FIG. 1B seems to be non-defective. Many circuit elements are formed on body 4 and then body 4 is diced into small chips (0.5"×0.5 mm or 0.5 mm□). FIG. 1C shows an example of the resultant diced body 4 (observed by photograph, not by infrared topography).

In the illustration of FIG. 1C, the vertical and horizontal lines indicate the dicing lines with pitch of 0.5 mm, and the slant lines indicate the defective portions in which parts of bonded 0.5 mm□ chips are peeled off from their bonding interfaces, as is shown in FIG. 1D. Even if such peeling off does not happen, insufficient bonding of the chips abnormally increases the electrical resistance thereof and, therefore, such chips are also defective. In critical cases, bonded semiconductor body 4 itself is cracked an broken during the process of polishing or manufacturing the device (dicing).

SUMMARY OF THE INVENTION

It is accordingly an object of this invention to provide a method for manufacturing bonded semiconductor bodies that is free of problems such as high electrical resistance at some locations of the bodies and cracking or breakage during the polishing step or device forming step, thus attaining a high yield.

Another object of this invention is to provide a method for manufacturing bonded semiconductor bodies which can provide a substantially uniform image when observed by use of infrared topography.

A method for manufacturing bonded semiconductor bodies according to this invention comprises the steps of bringing the mirror surfaces of semiconductor substrates of the same type or different types, which may be chemical compound semiconductor substrates of GaAs, InP or GaP, silicon substrates and germanium substrates, into close contact with each other; and then subjecting the semiconductor substrates to a heat treatment at a temperature of higher than 200° C. to bond the contacted mirror surfaces together. In this manufacturing method, the surface roughness of the mirror surfaces of the semiconductor substrates used is set equal to or less than 130 Å at its maximum height for a measured range of 1 mm which is the length defined on a reference plane provided in a predetermined area on the mirror surface.

If the surface roughness is set less than 130 Å at its maximum height for the measured range of 1 mm on the reference plane provided in an area to be observed, dark portions like a sea in the surface of the moon or Mars will not appear in the image observed by use of infrared topography.

Next, semiconductor substrates having the surface roughness (maximum magnitude between the top and bottom) in the range of 50 to 300 Å were prepared, a plurality of pairs of semiconductor substrates having the same surface roughness were bonded with each other to form a plurality of bonded semiconductor bodies, then the bonded semiconductor bodies were subjected to the breakdown test, and the percentage of non-bonded semiconductor substrates in which cracks or breakage occurred were derived as the bonding property (%) for the respective surface roughnesses. FIG. 2 shows the dependency of the bonding property on the surface roughness. As is clearly seen from FIG. 2, the bonding property is abruptly lowered when the surface roughness exceeds 130 Å (indicated by one-dot-dash line).

Further, Al electrodes were formed on each of the same test bonded semiconductor bodies as were used in the test shown in FIG. 2, and diced into 2 mm□ test pieces, and then the resistance of the test pieces was measured. In this case, the wafer used for the bonding was a P-type layer with the resistivity of 0.014 to 0.015 Ω.cm. Then, variation $\sigma$ in the resistances of the diced test pieces was derived as the percentage (%) of the average resistance. FIG. 3 shows the dependency of the resistance variation on the surface roughness. As is clearly seen from FIG. 3, the resistance variation abruptly increases when the surface roughness exceeds 130 Å as in the case of the bonding property shown in FIG. 2.

From the test results described above, it is understood that, if the surface roughness in a range of 1 mm on the reference plane of the surface is set less than 130 Å, said dark portion can be removed from the image observed by use of infrared topography, and the uniformity of the resistance and the bonding property can be significantly improved. That is, the dark portions in the image observed by the infrared topography indicate incomplete contact portions and the property of the bonded semiconductor body can be significantly improved by setting the surface roughness less than 130Å.

In this invention, it should be noted that the measured range in the reference plane provided on the surface is set to be 1 mm and set the maximum surface roughness to 130 Å. Further, the total thickness variation (TTV) of the entire surface of the wafer used here is set less than 5 μm.

BRIEF DESCRIPTION OF THE DRAWINGS

FIG. 4 is a graph showing the result of the void test derived by use of infrared topography with respect to comparison samples to which this invention is not applied and samples according to this invention;

FIG. 5 is a graph showing the result of the yield test for bonded semiconductor bodies with respect to comparison samples to which this invention is not applied and samples according to this invention;

FIG. 6 shows the bonding condition of a bonded semiconductor body (sample A) according to this invention, wherein sample A is diced into 0.5 mm □ pieces and is observed by use of infrared topography;

FIGS. 6A to 6C show the results of measurement of the surface roughness in three given points in FIG. 6;

FIG. 7 shows the bonding condition of a bonded semiconductor body (sample B) to which this invention is not applied, wherein sample B is diced into 0.5 mm□ pieces and is observed by use of infrared topography, wherein cross-hatching portion indicates incomplete bonding portions; and FIGS. 7A to 7C show the results of measurement of the surface roughness in three given points in FIG. 7.

DETAILED DESCRIPTION OF THE PREFERRED EMBODIMENTS

This invention will now be described with reference to samples 1 and 2.

Sample-1

First, more than 500 N-type silicon wafers were prepared, each of which has a diameter of 100 mm and the resistivity of 20 to 30 Ω.cm, each of whose total thickness variation (TTV) is less than 5 μm, and each of whose surface roughness ranges from 30 Å to 280 Å. The measurement of the surface roughness was effected by use of non-bonded surface roughness measuring device, Model "Surfcom 920A" (spot diameter of 1.6 μm) manufactured by Tokyo Seimitsu Co. Ltd., Japan, and the maximum height was measured in five areas on the wafer with a magnification factor of 1,000,000 and a measurement distance of 1 mm. The average of the measurements was used to determine the surface roughness.

Then, 500 wafers having the surface roughness of less than 130 Å were selected as one lot from the originally prepared and measured wafers, and 250 sets of contact wafers were formed by respectively contacting together two wafers selected out of the lot. After this, the 250 sets of contact wafers were subjected to bonding heat treatment at a temperature of 1100° C. (lower than the melting point of the wafer) in an $N_2$ gas atmosphere (the melting point of the Si wafer is approx. 1400° C.).

As a comparison sample, 500 wafers whose surface roughness ranges from 30 Å to 280 Å were randomly prepared, and 250 bonded wafers of the comparison sample were formed in the same manner as in the sample-1.

FIG. 4 shows the state of voids in the bonded wafers of the sample-1 and the comparison sample when observed by means of infrared topography before heat treatment. As is seen from FIG. 4, the voids in the comparison sample includes voids which are caused by dust and are indicated by interference fringes, and voids due to the roughness indicated by dark portions similar to a sea on the moon or Mars. However, the voids in the sample-1 includes only void caused by dust and the amount thereof is substantially the same as the comparison sample, and includes no voids due to the roughness.

FIG. 5 is a graph showing the yield of bonded semiconductor bodies with respect to the comparison sample and sample-1, both of which have been subjected to the same device forming process. As is clearly seen from FIG. 5, the yield of the sample-1 is higher than that of the comparison sample by 13%, and it has been determined that the improvement in the yield could be attained because the surface roughness was set less than 130 Å to thereby completely prevent the occurrence of cracks in or breakage of the semiconductor substrates.

Figure 1A:
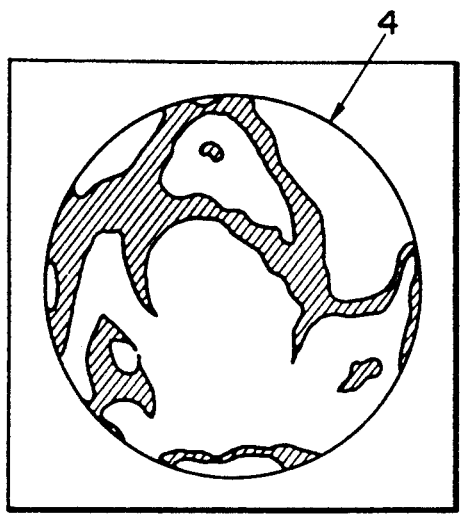
FIG. 1A is an example illustration of dark portions like the surface of the moon or Mars, which can be seen when a bonded semiconductor body is observed by infrared topography.
Figure 1B:
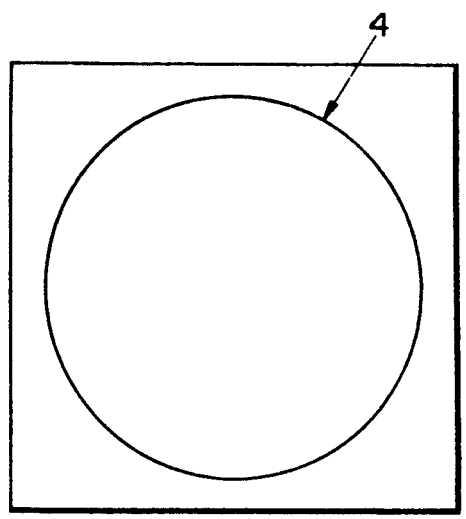
FIG. 1B shows the condition of a heat-treated bonded semiconductor body, observed by infrared topography.
Figure 1C:
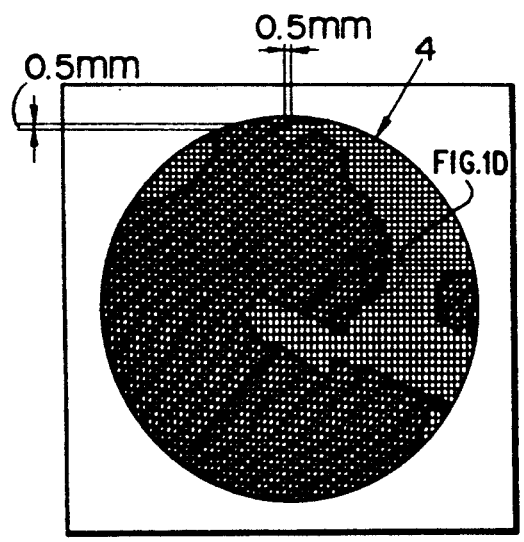
FIG. 1C is an example illustration of the bonded semiconductor body which is diced into small chips, wherein the area of the slant lines are defective.
Figure 1D:
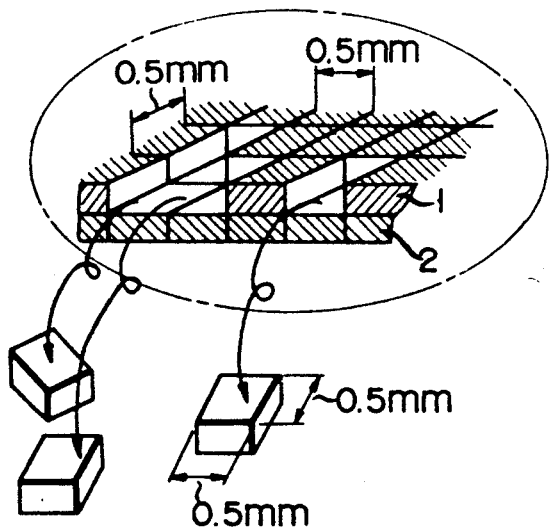
FIG. 1D shows part of the defective area shown in FIG. 1C, wherein parts of the bonded chips are peeled off from their bonding interfaces.
Figure 1:
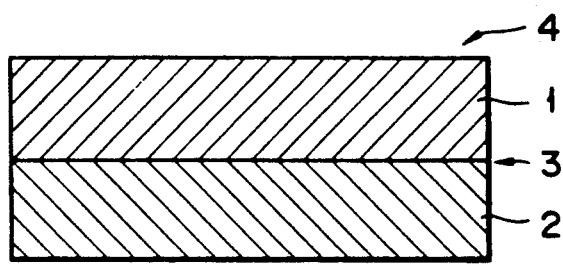
FIG. 1 is a cross sectional view schematically showing the construction of a bonded semiconductor body.
Figure 2:
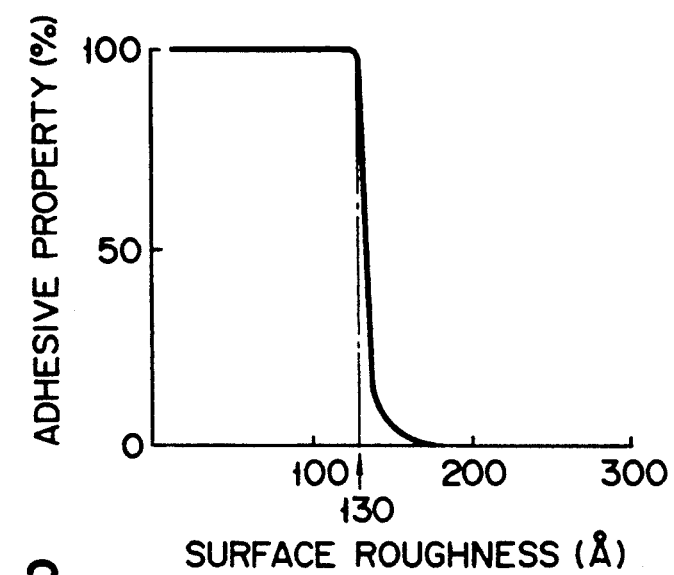
FIG. 2 is a graph showing the relation between the surface roughness and the bonding property of the bonded semiconductor body.
Figure 3:
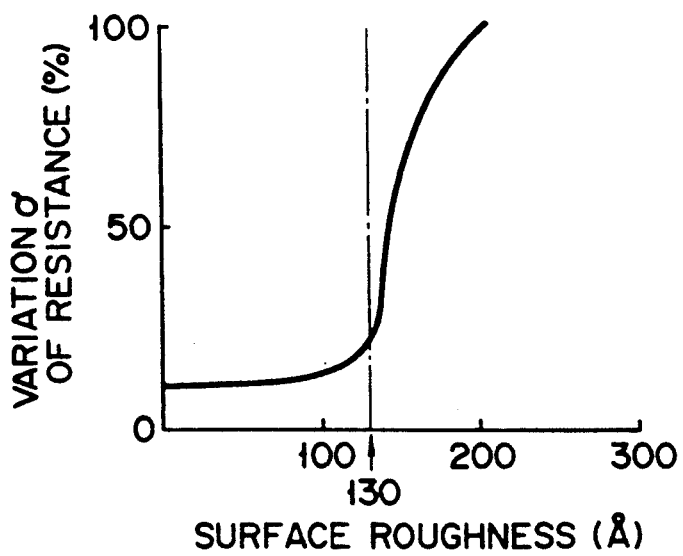
FIG. 3 is a graph showing the relation between the surface roughness and the resistance variation ($\sigma$) of the bonded semiconductor body.

Further, it has also been determined that variations in the element characteristics (cf. FIG. 3) relating to the bonding interface in the element of the sample-1 was significantly improved in comparison with that of the comparison sample.

The same tests as that described above were repeatedly performed, and the same results those the surface roughness of 130 Å is a critical value were obtained.

At present, wafers with the roughness of less than 130 Å can be easily obtained from various wafer makers. Further, complete mirror surface wafers with the surface roughness of 130 Å or less can be obtained by use of the polishing method disclosed in the following Japanese documents:

"Papers in the scientific lectures in autumn meeting of 'SEIKI GAKKAI', Showa-56 (1981)" pp 440–451, by Michio Ishikawa.

In the above explanation, the infrared topography is used for observation of the bonding interface. However, it is possible to use ultrasonic waves with a frequency of 10 to 30 MHz or higher frequency. As examples of methods utilizing the ultrasonic waves, there is a method using computer tomography which is well known in the art and another method utilizing the reflection of the ultrasonic waves at the bonding interface. The latter method utilizing the reflection of the ultrasonic waves is disclosed in, for example, Japanese Patent Disclosure No. 62-122141. (according to this Japanese Patent Disclosure, ultrasonic waves of higher than 30 MHz are used).

The technique of bonding two semiconductor wafers by the use of heat treatment is disclosed in, for example, the following U.S. Patent Specifications. The contents of these U.S. Patent Specifications are incorporated into this application by reference.

U.S. Pat. No. 4,671,846 patented on Jun. 9, 1987, Shimbo et al, entitled "Method of Bonding Crystalline Silicon Bodies"; and U.S. Pat. No. 4,700,466 patented on Oct. 20, 1987, Nakagawa et al, entitled "Method of Manufacturing Semiconductor Device wherein Silicon Substrates are bonded together."

FIG. 6 shows the bonding condition of a bonded semiconductor substrate wafer (sample A) according to this invention. The surface roughness of sample A is less than 130 Å. Sample A is diced into 0.5 mm☐ pieces, and is observed by use of infrared topography. Further, FIGS. 6A to 6C show the results of measurement of the surface roughness (92 Å, 124 Å, and 106 Å) in three preset points in FIG. 6. FIG. 6 indicates that no voids are observed on the entire surface of the wafer.

Incidentally, the white ring illustrated at the outer periphery of the disk-like wafer sample A shown in FIG. 6 indicates a non-bonded area. The width of such a non-bonded area is generally about 2 mm for the wafer of 100 mm $\phi$ diameter, and occurrence of such area, due to inevitable round-off at the edge of a disk-like wafer, cannot be avoided in practice. However, such a non-bonded area causes no problem because it is removed during the manufacturing process thereof, and it is not relevant to the content of the present invention.

FIG. 7 shows the bonding condition of a bonded semiconductor substrate wafer (sample B) to which this invention is not applied. Sample B includes not only areas having a surface roughness of less than 130 Å, but also those having a surface roughness of more than 130 Å. Sample B is diced into 0.5 mm☐ pieces, and is observed by use of infrared topography, wherein a cross-hatching portion indicates incomplete bonding portions. FIGS. 7A to 7C show the results of measurement of the surface roughness (286 Å, 124 Å, and 146 Å) in three preset points in FIG. 7. In FIG. 7, the white area indicates that the surface roughness (124 Å) is less than 130 Å and there are no voids, and the cross-hatching portion indicates that the surface roughness (286 Å and 146 Å) is more than 130 Å and incomplete contact due to voids has occurred.

Sample-2

The same test as that described above was effected using a semiconductor substrate of Ge, GaAs, InP, or GaP having the surface roughness around 70 to 80 Å, and the same result as in the sample-1, in which the property is greatly changed with surface roughnesses of more and less than 130 Å, was obtained.

According to the method of this invention for manufacturing bonded semiconductor bodies, the surface roughness of the semiconductor substrate prior to the bonding is set less than 130 Å so that incomplete contact due to the roughness of the substrate surface can be effectively prevented. As a result, it becomes possible to significantly reduce the number of defective bonded semiconductor bodies due to substrate cracks or breakage. Further, variations in the electrical characteristics of the bonding interface can be sufficiently suppressed, and therefore the element characteristics of the bonded semiconductor body can be made stable.

As described above, the manufacturing method of this invention contributes to low manufacturing cost and an increase in yield of chips by use of bonded semiconductor bodies.

What is claimed is:

1. A method for manufacturing a bonded semiconductor body, said method comprising the steps of:
   preparing a predetermined number of silicon substrates each with a predetermined diameter, resistivity, and total thickness variation, and with a surface roughness within 30 Å to 280 Å in a range of 1 mm length;
   bringing flat mirror surfaces of the semiconductor substrates together in close contact in pairs at a bonding interface of each pair;
   subjecting each of said semiconductor substrates to infrared topography to detect images corresponding to voids on said bonding interface; and
   selecting pairs of semiconductor substrates in which no images appeared, each said semiconductor substrate of said pair thereby having a flat mirror surface with a surface roughness of less than 130 Å in a range of 1 mm length.

2. A method according to claim 1, wherein the total thickness variation of said first and second semiconductor substrates is set less than 5 $\mu$m on the entire contacted surface thereof.

3. A method according to claim 1, wherein said first semiconductor substrate is formed of a material selected from a group essentially consisting of Si, Ge, InP, and GaP.

4. A method according to claim 3, wherein said second semiconductor substrate is formed of material selected from a group essentially consisting of Si, Ge, InP, and GaP.

5. A method according to claim 1, wherein said predetermined temperature is equal to or higher than 200° C. and lower than the melting point of said first and second semiconductor substrates.

6. A method according to claim 5, wherein said selected period of time is longer than about 2 hours.

7. A method according to claim 5, wherein said predetermined atmosphere is provided by nitrogen gas.

8. A method for manufacturing a bonded semiconductor body, said method comprising the steps of:
   preparing a predetermined number of silicon substrate wafers each with a predetermined diameter, resistivity, and total thickness variation, and with a surface roughness within 30 Å to 280 Å in a range of 1 mm length;
   bonding flat mirror surfaces of the semiconductor substrate wafers used as semiconductor element substrates;
   subjecting said contacted mirror surfaces to infrared topography to detect images corresponding to voids on said contacted mirror surfaces; and
   selecting ones of said semiconductor substrate wafers in which no images appeared, each selected wafer thereby having a surface roughness of less than 130 Å in a range of 1 mm length.

9. A method for manufacturing a bonded semiconductor body, said method comprising the steps of:
   preparing a predetermined number of silicon wafers each with a predetermined diameter, resistivity, and total thickness variation, and with a surface roughness within 30 Å to 280 Å in a range of 1 mm length;
   bonding flat mirror surfaces of pairs of said silicon wafers at a bonding interface of each pair;
   subjecting each said bonding interface to infrared topography to detect images corresponding to voids on each said bonding interface of the pairs of silicon wafers; and
   selecting silicon wafers having no images and thereby having a flat mirror surface with a surface roughness of less than 130 Å in a range of 1 mm length.

10. A method according to claim 9 wherein the first and second semiconductor substrates selected from the predetermined number of silicon wafers are selected to have a surface roughness of between 70 and 80 Å in a range of 1 mm length.

11. A method according to claim 10 wherein the predetermined number of silicon wafers are formed of material from a group consisting essentially of Ge, GaAs, InP, and GaP.

12. A method according to claim 9 wherein the predetermined diameter if 100 mm.

13. A method according to claim 12 wherein the predetermined resistivity is within the range of 20 to 30 $\Omega$·cm.

14. A method according to claim 9 wherein the predetermined total thickness variation is less than 5 $\mu$m.

15. A method for manufacturing a bonded semiconductor body, said method comprising the steps of:
   preparing a predetermined number of semiconductor substrates each with a predetermined diameter, resistivity, and total thickness variation, and with a surface roughness within 30 Å to 280 Å in a range of 1 mm length;
   bringing flat mirror surfaces of the semiconductor substrates together in close contact in pairs at a bonding interface of each pair;
   subjecting said pairs to infrared topography to detect images corresponding to voids on said bonding interfaces;
   selecting said pairs in which no images appeared, each of said semiconductor substrates of said selected pairs thereby having a flat mirror surface with a surface roughness of less than 130 Å in a range of 1 mm length; and
   subjecting each of said semiconductor substrates of said pairs to a heat treatment at a predetermined temperature for a selected period of time in a predetermined atmosphere.

16. A method for manufacturing a bonded semiconductor body, said method comprising the steps of:
   preparing a predetermined number of silicon substrate wafers each with a predetermined diameter, resistivity, and total thickness variation, and with a surface roughness within 30 Å to 280 Å in a range of 1 mm length;
   bonding flat mirror surfaces of the semiconductor substrate wafers used as semiconductor element substrates in pairs;
   subjecting said bonded mirror surfaces to infrared topography to detect images corresponding to voids on said bonded mirror surfaces;
   selecting ones of said semiconductor substrate wafers in which no images appeared and thereby having a surface roughness of less than 130 Å in a range of 1 mm length; and
   subjecting said pairs of semiconductor substrate wafers to a heat treatment at a temperature higher than substantially 200° C. and lower than the melting point of said semiconductor substrate wafers to further bond the mirror surfaces together.

17. A method for manufacturing a bonded semiconductor body, said method comprising the steps of:
   preparing a predetermined number of silicon wafers each with a predetermined diameter, resistivity, and total thickness variation, and with a surface roughness within 30 Å to 280 Å in a range of 1 mm length;
bonding flat mirror surfaces of pairs of said silicon wafers at a bonding interface of each pair;
subjecting each said bonding interface to infrared topography to detect images corresponding to voids on each said bonding interface of the pairs of silicon wafers;
selecting said silicon wafers having no images and thereby having a flat mirror surface with a surface roughness of less than 130 Å in a range of 1 mm length; and
subjecting each said pair to heat treatment at a predetermined temperature for a selected period of time in a predetermined atmosphere.

* * * * *